United States Patent [19]
Ball et al.

[11] Patent Number: 5,177,754
[45] Date of Patent: Jan. 5, 1993

[54] MAGNETIC COMPRESSION LASER DRIVING CIRCUIT

[75] Inventors: Don G. Ball, Livermore; Dan Birx, Brentwood; Edward G. Cook, Livermore, all of Calif.

[73] Assignee: The United States of America as represented by the United States Department of Energy, Washington, D.C.

[21] Appl. No.: 336,451

[22] Filed: Mar. 15, 1989

Related U.S. Application Data

[63] Continuation of Ser. No. 915,163, Sep. 25, 1986, abandoned.

[51] Int. Cl.$^5$ .............................................. H01S 3/00
[52] U.S. Cl. ..................................... 372/38; 359/333
[58] Field of Search ............... 372/25, 30, 38, 56, 372/81, 82; 455/609, 611; 330/4.3

Primary Examiner—Mark Hellner
Attorney, Agent, or Firm—Roger S. Gaither; L. E. Carnahan; William R. Moser

[57] ABSTRACT

A magnetic compression laser driving circuit is disclosed. The magnetic compression laser driving circuit compresses voltage pulses in the range of 1.5 microseconds at 20 Kilovolts of amplitude to pulses in the range of 40 nanoseconds and 60 Kilovolts of amplitude. The magnetic compression laser driving circuit includes a multi-stage magnetic switch where the last stage includes a switch having at least two turns which has larger saturated inductance with less core material so that the efficiency of the circuit and hence the laser is increased.

11 Claims, 18 Drawing Sheets

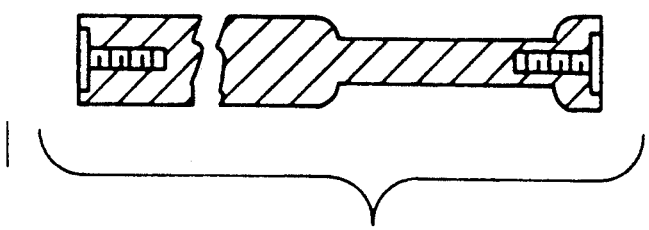 
FIG. 13A     FIG. 13B
 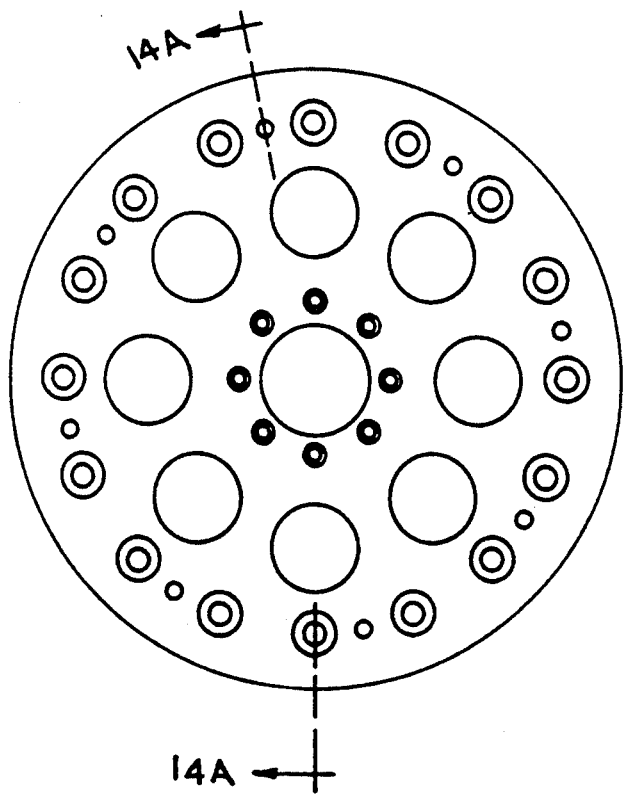
FIG. 14A     FIG. 14B 5,177,754

MAGNETIC COMPRESSION LASER DRIVING CIRCUIT

FIELD OF THE INVENTION

The U.S. Government has rights in this invention pursuant to Contract No. W-7405-ENG-48 between the U.S. Department of Energy and the University of Calif. for the operation of the Lawrence Livermore National Laboratory.

This is a continuation of application Ser. No. 915,163 filed Sep. 25, 1986 abandoned.

CROSS-REFERENCE TO RELATED APPLICATION

This application is related to the patent application entitled "Coupling Apparatus for a Metal Vapor Laser, " Ser. No. 915,163 filed Sep. 25, 1986, 6(IL-7317, FHTAH No. A-39568), now abandoned which is assigned to the same assignee as the present invention.

BACKGROUND OF THE INVENTION

The present invention relates to a magnetic compression laser driving circuit.

Magnetic compression circuits are known in the prior art for compressing a first series of voltage pulses, each having a first duration to form a second series of voltage pulses having a shorter duration. The first series of voltage pulses are typically generated by a thyratron circuit. The second series of voltage pulses can be used for application to lasers such as a metal vapor laser to effect generation of a corresponding series of laser beam pulses. Suce pulsed lasers are utilized in many applications, such as medical diagnostic applications, laser isotope separation of an atomic vapor (known as an AVLIS process) and many other applications.

A magnetic compression circuit generally utilizes a multi-stage LC network to provide suitable compression of a first series of voltage pulses to form a second series of voltage pulses having a shorter duration, which are suitable for application to a laser discharge circuit. Such magnetic compression circuits usually include a switching means at the last stage which has only one turn. This generally requires more core material, which reduces the efficiency of the magnetic compression circuit. The reduction in efficiency of the magnetic compression circuit can have dramatic effects with respect to the overall operation of the laser itself, particularly when high power laser applications are desired. For example, in an AVLIS process, the laser isotope separation process requires operation of laser power in the range of hundreds of watts of power or more for significantly long periods of time e.g., more than a thousand hours). Using a magnetic compression circuit having relatively poor efficiency to effect generation of a series of laser beams necessarily can affect the overall operation of the AVLIS process.

SUMMARY OF THE INVENTION

It is an object of the present invention to provide an improved magnetic compression laser driving circuit.

It is another object of the present invention to provide a magnetic compression laser driving circuit which is more efficient.

It is a more particular object of the present invention to provide a magnetic compression laser driving circuit which includes a plurality of multi-stage magnetic switch compression means wherein the last stage has at least two turns.

The magnetic compression laser driving circuit comprises means for generating a first series of voltage pulses having a pulse duration in the range of 1.5 microseconds and having a 20 Kilovolt amplitude and magnetic compression means for compressing the first series of voltage pulses to generate a second series of voltage pulses having a second compressed duration of approximately 40 nanoseconds and having a second voltage amplitude, larger than the first amplitude, where the second amplitude is approximately 60 Kilovolts.

The magnetic compression means includes multi-stage switch means where the last stage of the switch means has at least two turns. The circuit includes means for applying the second series of pulses to a laser to effect generation of a series of laser pulses which corresponds to the second series of pulses in terms of repetition rate.

By utilizing a switch means which has at least two turns in the last stage of the magnetic compression laser driving circuit, the present invention is more efficient than prior art circuits with respect to effecting generation of pulsed laser beams. This improved efficiency necessarily increases the overall efficiency of the laser system itself.

Additional objects, advantages and novel features of the present invention will be set forth in part in the description which follows and in part become apparent to those skilled in the art upon examination of the following, or may be learned by practice of the invention. The objects and advantages and features of the present invention may be realized and attained by means of the instrumentalities and combinations particularly pointed out in the appended claims.

BRIEF DESCRIPTION OF THE DRAWINGS

The accompanying drawings, which are incorporated in and form a part of this specification, illustrate an embodiment of the invention and, together with the following detailed description, serve to explain the principles of the invention.

FIGS. 12–23 depict a view of the various components which form part of the output stage of the magnetic switch according to the present invention.

DETAILED DESCRIPTION OF THE DRAWINGS

Reference will now be made in detail to the preferred embodiment of the invention, an example of which is illustrated in the accompanying drawings. While the invention will be described with that preferred embodiment, it will be understood that it is not intended to limit the present invention to that embodiment. On the contrary, it is intended to cover alternatives, modifications and equivalents as may be included within the spirit and scope of the invention as defined by the appended claims.

Figure 1:
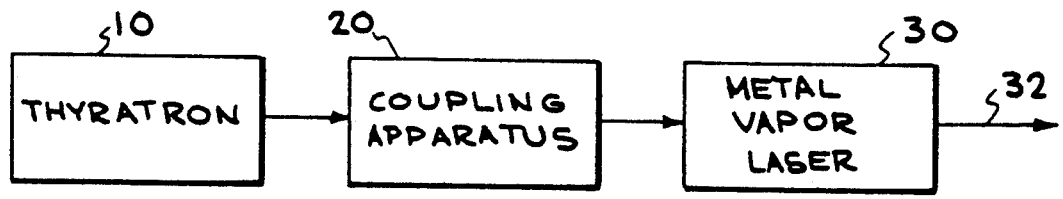
FIG. 1 depicts a block diagram of a coupling apparatus for a metal vapor laser for describing the nature of excitation of metal vapor lasers.

Referring now to FIG. 1, a block diagram of a coupling apparatus for a metal vapor laser is depicted. The aspects of such a coupling apparatus will first be described to provide a overview of effecting the generation of a series of laser beam pulses. Afterwards, a more detailed description of the aspects of the present invention will be provided in conjunction with FIGS. 8-10.

In FIG. 1, a thyratron circuit is connected to a coupling apparatus 20, which in turn is connected to a large bore metal vapor laser 30. Thyratron circuit 10 is itself known in the art and need not be described in great detail. The purpose of thyratron circuit 10 is to generate and apply a series of high voltage, high repetition rate pulses to coupling circuit 20. The high voltage pulses are desirably 20 KV or thereabouts and the repetition rate is desirably 5 KHz or higher.

Coupling apparatus 20 is responsive to the first series of high voltage, high repetition rate pulses from thyratron circuit 10 and in response thereto increases the high voltage pulses to a second series of pulses having a higher amplitude voltage, desirably in the range of 38 KV to 40 KV. Coupling apparatus 20 couples the higher voltage (38–40 KV), high pulse rate (5 KHz or more) pulses to metal vapor laser 30 (desirably a copper vapor laser).

Because coupling apparatus 20 applies the higher voltage, high repetition rate pulses to laser 30, a much more efficient and powerful laser beam 32 can be generated. Moreover, as will be described, coupling apparatus 20 provides for an improved laser beam generation while at the same time improving or maintaining the normal operating life of thyratron circuit 10. This is to be contrasted with attempting to operate the thyratron itself at the high voltage, which would be impractical, since its useful operating life would be too short, for the reasons previously indicated.

Figure 2:
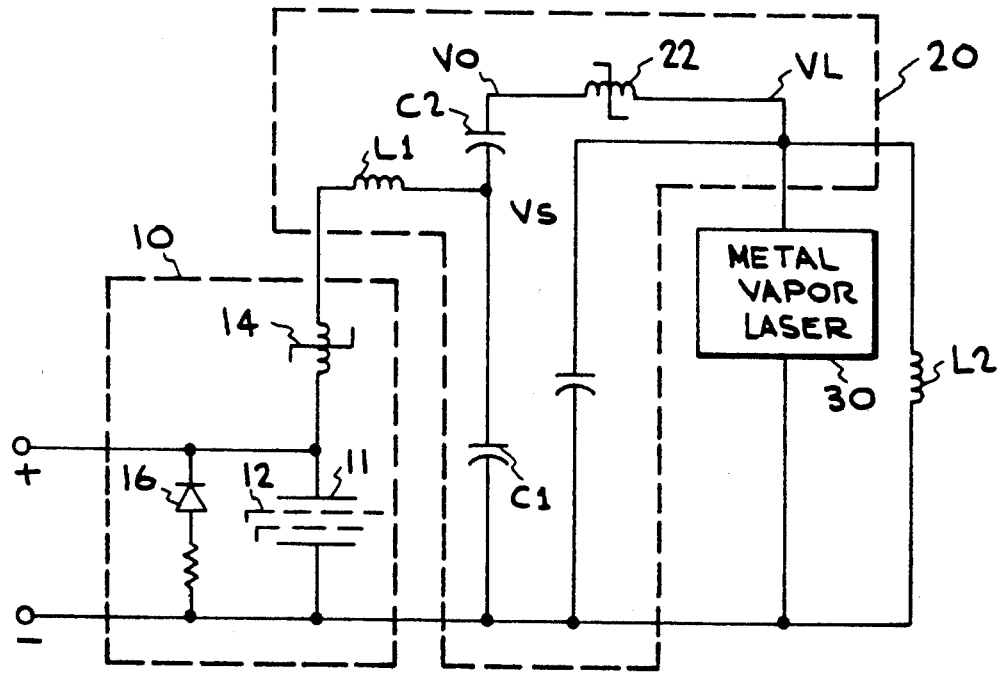
FIG. 2 depicts a schematic diagram of the coupling apparatus of FIG. 1.

Referring now to FIG. 2, a schematic diagram of a coupling apparatus is depicted. The present invention is intended to be utilized with metal vapor type lasers, particularly a small bore copper vapor laser as contrasted with a large bore copper vapor laser. Large bore lasers can be characterized as lasers having a bore diameter of approximately six centimeters or more.

As previously described, thyratron circuits provide a means of applying high voltage pulses to the laser equipment. However, there are two problems with existing thyratron circuits. First, the voltage amplitude pulses generated are generally not sufficiently large enough and fast enough for the operating requirements of large bore metal vapor lasers.

In addition, increasing the power output of metal vapor lasers limits the overall operating lifetime of the thyratron circuit, as previously discussed.

Referring now to FIG. 2, coupling apparatus 20 is depicted for coupling the output of a thyratron circuit 10 to a metal vapor laser 30 with sufficiently high voltage amplitude pulses (e.g., 38–40 KV) at a high repetition rate (e.g., 5 KHz or more) while at the same time maintaining a suitable operating lifetime of the thyratron circuit 10.

In FIG. 2, thyratron circuit 10 receives suitable trigger pulses from a known source (not shown) applied through grid 12. The pulses typically have a repetition rate of 5 KHz and are applied through grid 12 to thyratron 10 in a known fashion. In response thereto, thyratron tube 11 generates a series of high voltage pulses for connection to the coupling apparatus 20, the purpose of which is to generate very high voltage pulses with the same repetition rates for coupling to metal vapor laser 30. The thyratron circuit 10 includes magnetic assist coil 14, which serves to delay the rise of current through thyratron 10, thus aiding in maintaining a suitable operating lifetime. The inverse diode 16 is provided to permit reverse current to pass around the thyratron circuit 10, rather than arc through thyratron tube 11, which could result in a reduced lifetime.

Thyratron circuit 10 generates 20 KV series pulses when triggered by a corresponding series of trigger pulses on grid 12. However, in a desirable application, laser circuit 30 requires approximately 40 KV pulses with sufficient pulse repetition rates of 5 KHz or more, which is beyond the normal operating capabilities of a typical thyratron circuit.

In FIG. 2, a first inductor L1 receives the high voltage pulses from thyratron circuit 10 (through magnetic assist coil 14). The purpose of inductor L1 is to, in effect, aid in limiting the peak current through thyratron 10 and provide for suitable voltage reversal of capacitor C1.

Figure 3:
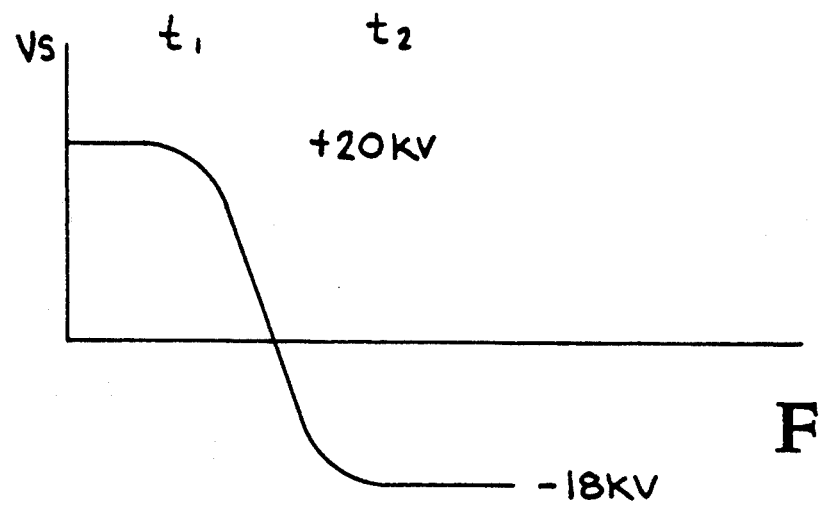
FIGS. 3–6 depict timing diagrams for illustrating the operation of the coupling circuit depicted in FIG. 2.

Referring now to FIG. 3, a timing diagram illustrating the charging across capacitor C1 in FIG. 2 is depicted. In FIG. 3, a trigger pulse occurs at time T1 and the charge VS across capacitor C1 will "reverse" from the indicated +20 KV at time T1 to approximately −18 KV at time T2. This charging of capacitor C1 to a charge of from +Q to −Q occurs in approximately 150–300 nanoseconds through the loop formed by C1, L1, coil 14 and thyratron circuit 10.

Inductor L1 has a value of approximately 400 nanohenries, which when taken in conjunction with the value of capacitor C1 (approximately 6 nanofarads) provides for a suitable time constant (L1C1) in the time frame indicated above.

Figure 4:
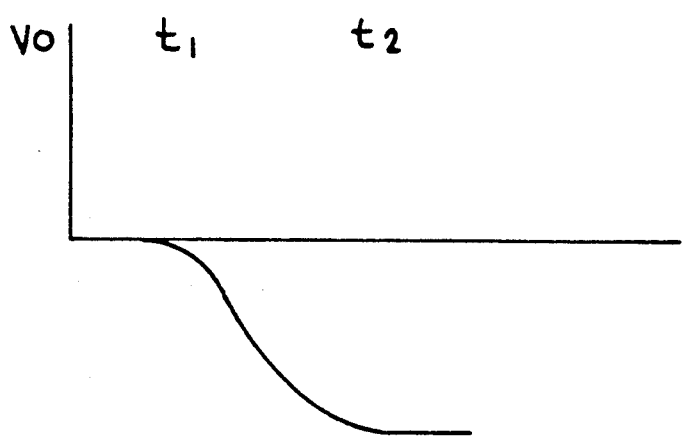

In FIG. 4, at time T1, the voltage V0 is the voltage across capacitor C2 and C1 of FIG. 2 which charges in the same time frame to approximately −38 KV.

As can be seen from FIG. 2, capacitors C1 and C2, when "connected" in series, will form approximately a doubled voltage (20 KV + 18 KV) or approximately 38 KV. This increased higher voltage developed across capacitors C1 and C2 can now be applied to laser circuit 30 through peaking switch 22.

Figure 5:
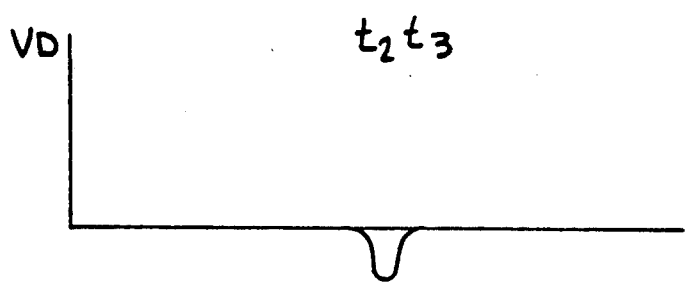

The voltage VL indicated in FIG. 2 can be applied to laser circuit 30 is the voltage combination across capacitor C1, C2 applied through peaking switch 22. At time T2, the discharge of capacitors C1 and C2, through peaking switch 22 is illustrated in FIG. 5. The time frame between times T2 and T3 is approximately 100 nanoseconds.

Figure 6:
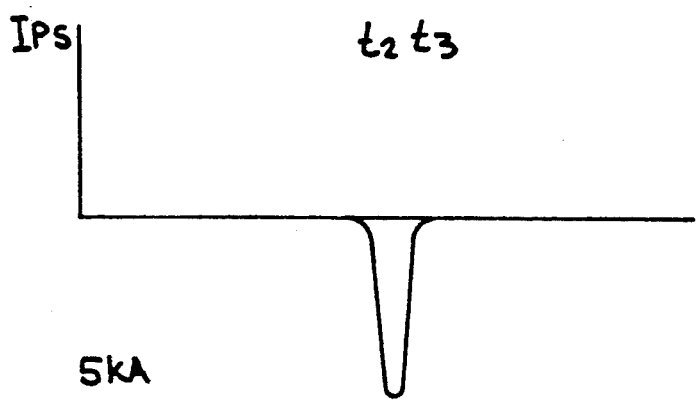

Capacitors C1 and C2 are connected, at the appropriate time, through peaking switch 22 to the load (laser 30) The peaking switch 22 develops a current flow as illustrated in FIG. 6, with the current peaking at approximately 5 KA. The peaking switch 22 initially looks to the rest of the coupling circuit as a large inductor (initially to time T2). At time T2 to T3, peaking switch 22 appears as a small inductor and couples the higher voltage (approximately 38 KV) to laser circuit 30. Inductor L2 in FIG. 2 is a charging inductor, and has a value typically of 200 microhenries.

As can be seen, the coupling circuit 20 provides, by means of peaking circuit 22, suitable coupling of larger amplitude pulses with high repetition rates to a large bore metal vapor laser circuit 30.

More details of the peaking circuit 22 are described in more detail in the above identified cross-referenced application entitled "Coupling Apparatus for a Metal Vapor Laser."

Figure 7A:
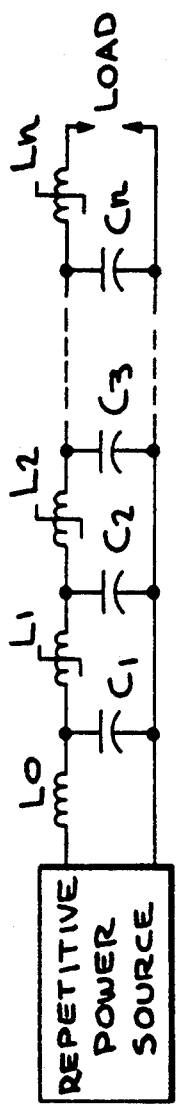
FIGS. 7A and 7B depict block diagrams of magnetic compression circuits known in the prior art.
Figure 7B:
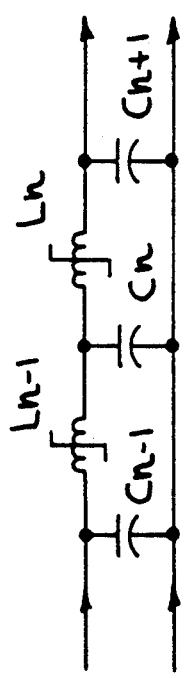

Referring now to FIGS. 7A and 7B, block diagrams of a magnetic switching circuit are illustrated. While the principles of magnetic compression are well known in the art, in order to give a better understanding of the aspects of the present invention, the operation of FIGS. 7A and 7B will be briefly described.

In FIG. 7A, capacitor C1 is charged through inductor L0 until L1 saturates. Inductor L1 is chosen to have a saturated inductance much less than L0. Once L1 saturates, C2 will begin to charge from C1 through L1, but because the saturation of L1 is much less than $L_0$, C2 charges much more rapidly than C1 does. The process continues through the successive stages until capacitor CN discharges into the laser.

The operation of a single stage is depicted in FIG. 7B. Immediately after saturation of inductor LN−1, capacitor CN−1 begins to discharge through inductor LN−1 into capacitor CN. The values of the capacitors are chosen to be approximately equal in order that capacitor CN−1 is fully discharged when CN is fully charged. Saturable inductor LN is designed so that it is approaching a saturated state when CN is fully charged. When $L_N$ saturates, capacitor CN will start to discharge through $L_N$ into CN+1.

Figure 7C:
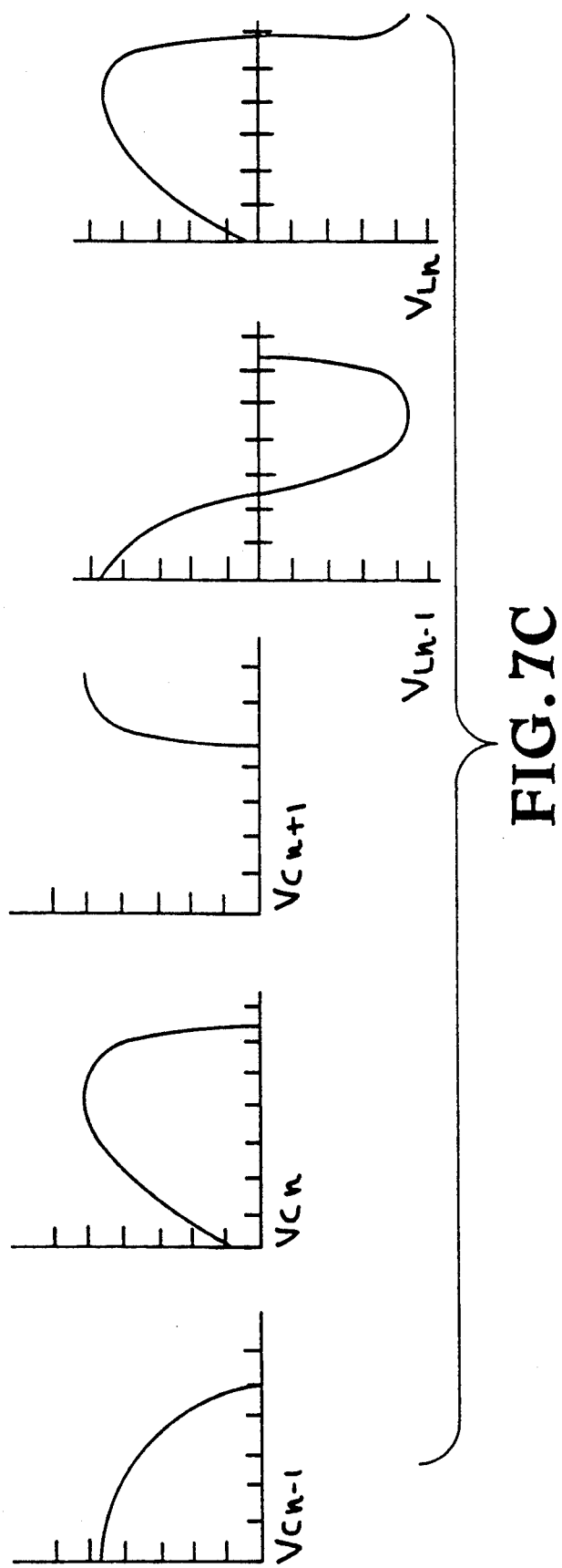
FIG. 7C depicts a timing diagram for illustrating the operation of the magnetic compression circuit of FIG. 7B.

The voltages across the components of FIG. 7B are illustrated in FIG. 7C.

Figure 8:
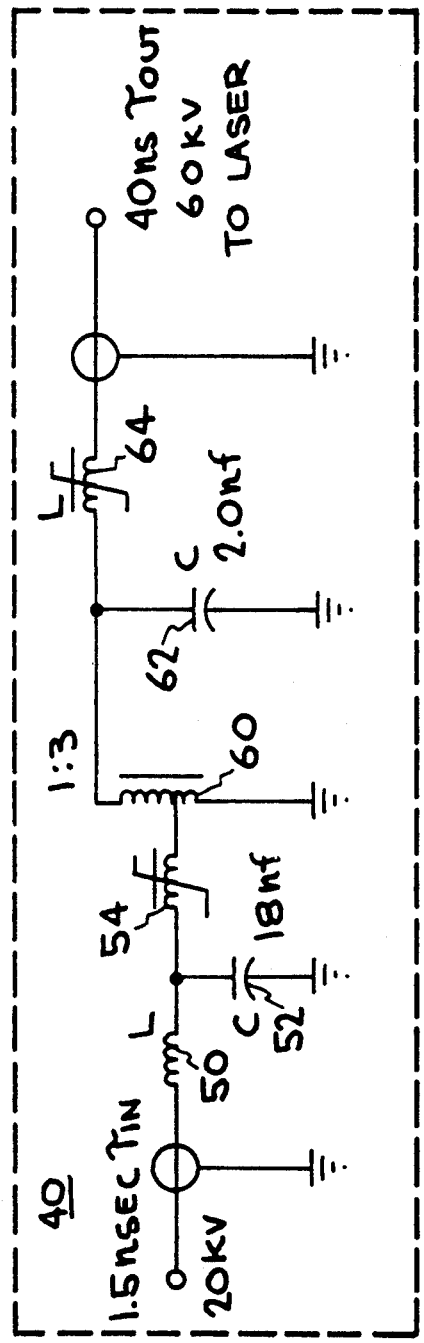
FIG. 8 depicts an electrical schematic diagram of a magnetic compression laser driving circuit according to the present invention.

Referring now to FIG. 8, an electrical schematic diagram of a magnetic compression laser driving circuit 40 according to the present invention is depicted. In FIG. 8, 20 Kilovolt voltage pulses having a pulse duration of approximately 1.5 microseconds is generated by suitable means, such as a thyratron circuit of FIG. 1 or an appropriate solid state device. The 20 Kilovolt, 1.5 microsecond voltage pulses are magnetically compressed through inductors 50, 54 and capacitor 52 through 1:3 step-up transformer 60 to capacitor 62 and inductor 64 to form a 40 nanosecond 60 Kilovolt series of voltage pulses for application to a suitable laser, such as laser 30 of FIG. 1. In a desired application, the laser 30 could be a metal vapor laser, and particularly a small bore metal vapor laser. However, a laser such as an excimer laser is suitable for purposes of the present invention.

As previously described, a multi-stage magnetic compression circuit such as depicted in FIG. 7 is known in the art. However, those stages provide at the last stage of the multistage network a magnetic switch which includes a switch which has in general only one turn. The problem with such prior art approaches for magnetic compression circuit applications is that more core material is generally required, which reduces the efficiency of operation of the magnetic compression circuit (and necessarily reduces the efficiency of operation of the laser).

Figure 9:
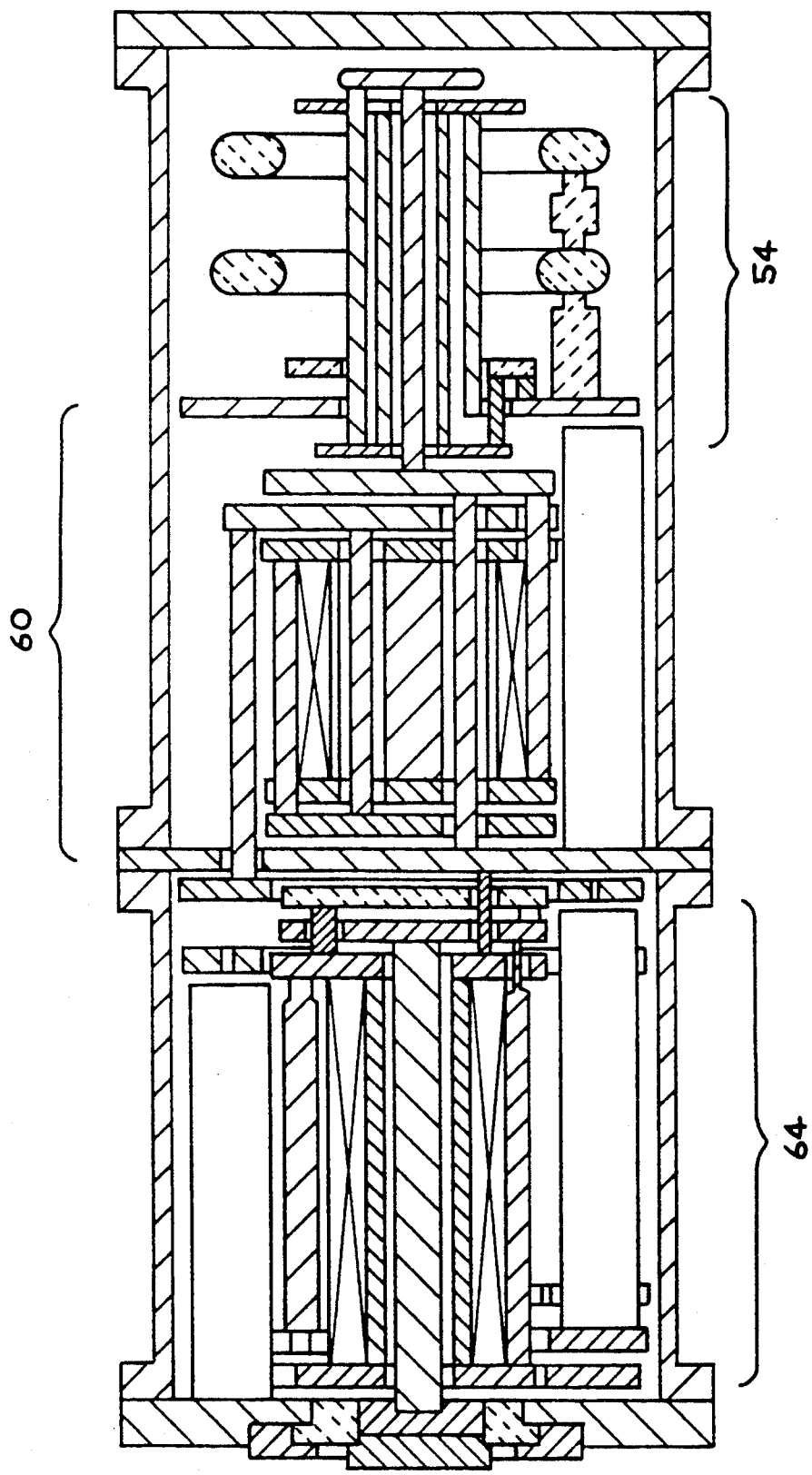
FIG. 9 depicts a cross-sectional view of a compression network according to the present invention.

Referring now to FIG. 9, a cross-sectional view of the magnetic compressor network, which includes a part of the last stage of the electrical circuit of FIG. 8, is depicted. In FIG. 9, the network includes a magnetic switch 54, auto transformer 60, and magnetic switch 64, all of which correspond to the electrical circuit depicted in FIG. 8. The magnetic switch 64 of FIG. 9 includes at least two turns. With metal vapor lasers such as a copper vapor laser, the impedance is high enough so that a magnetic switch stage such as depicted in FIG. 9 with at least two turns can be utilized. Furthermore, even though the magnetic switch of FIG. 9 has a larger saturated inductance, by providing at least two turns, it has less core material so that it is more efficient in terms of its overall operation.

Figure 10:
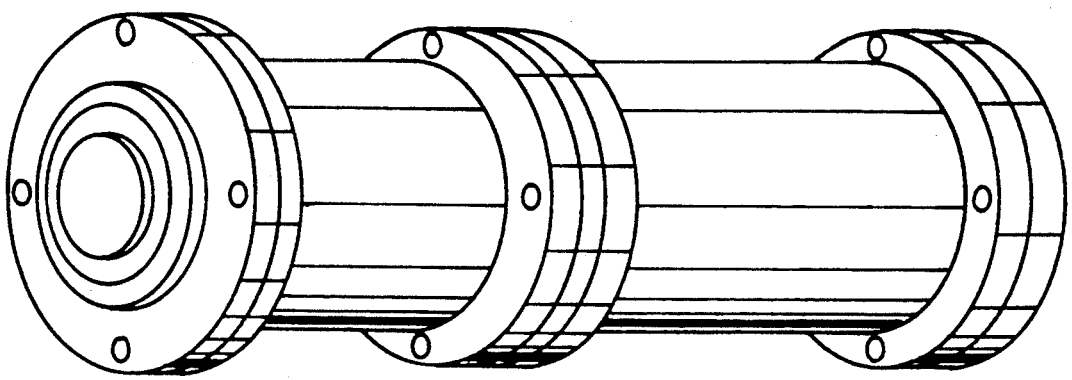
FIG. 10 depicts a perspective view of the magnetic switch network of FIG. 9.

FIG. 10 depicts a perspective view of FIG. 9.

Figure 11:
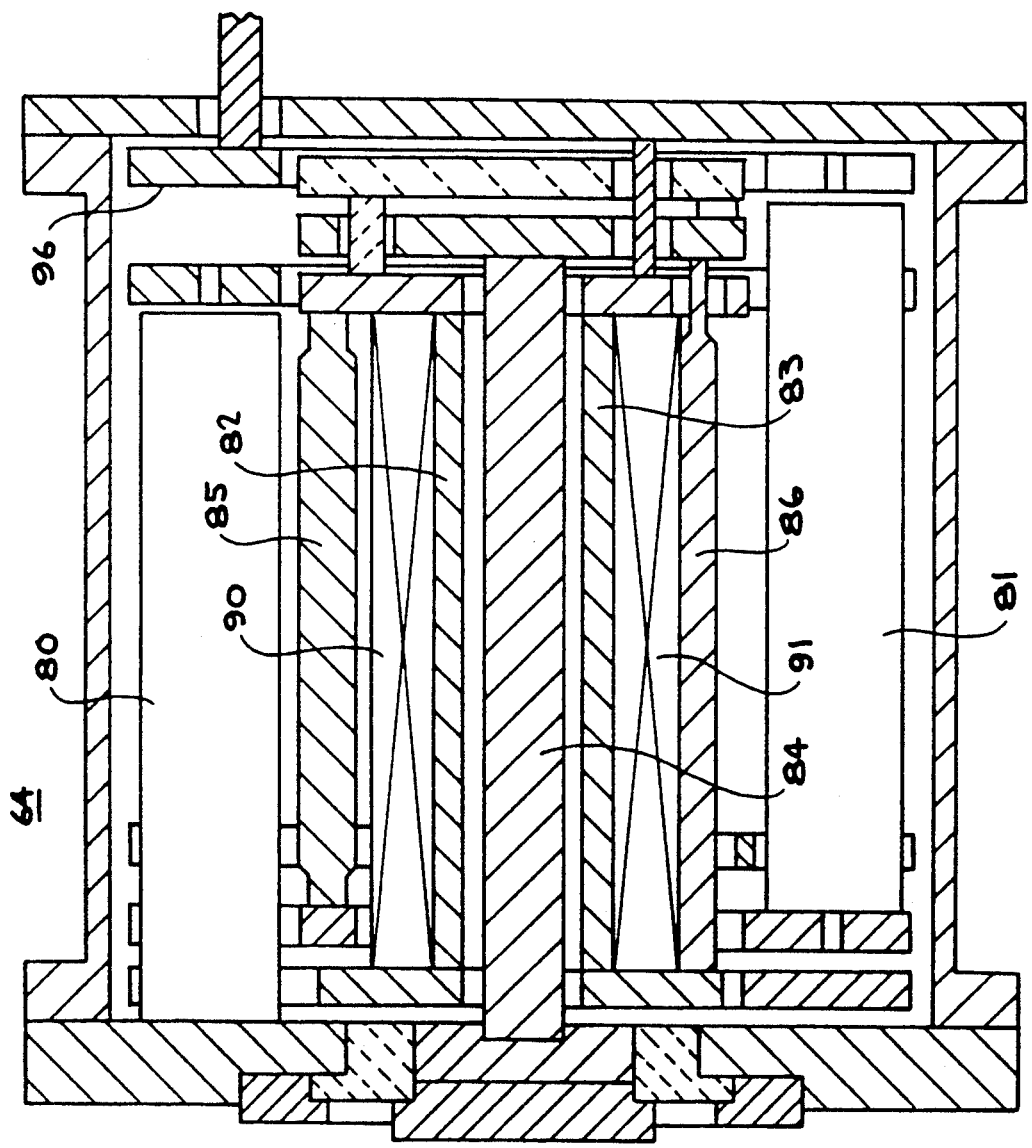

Referring now to FIG. 11, a more detailed view of the magnetic switch 64 of FIG. 9 is depicted. In FIG. 11, magnetic switch 64 includes capacitors 80, 81, which are effectively connected together in parallel. Capacitors 80, 81 correspond to capacitor 62 depicted in the electrical diagram of FIG. 8. The two turns of magnetic switch 64 include mandrels 82, 83, which form the first turn. The second turn is formed by rod 84. The magnetic switch 64 includes a magnetic material 90, 91, made by the Stackpole Company and called C7D. The assembly is also configured by suitable rods such as return rods 85, 86, and is supported by various supporting plates such as supporting plates 95, 96.

It is believed that magnetic switch 64 as depicted in FIG. 11 would become readily apparent to one of ordinary skill in the art. However, the component elements of the magnetic switch will now be described in the remaining Figures depicted herein.

Figure 12A:
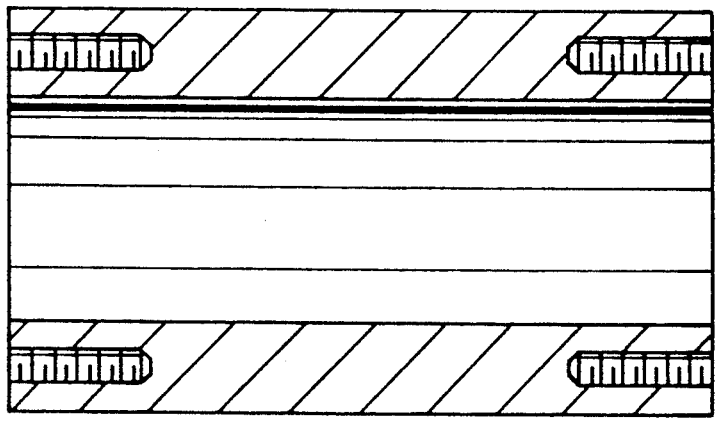
Figure 12B:
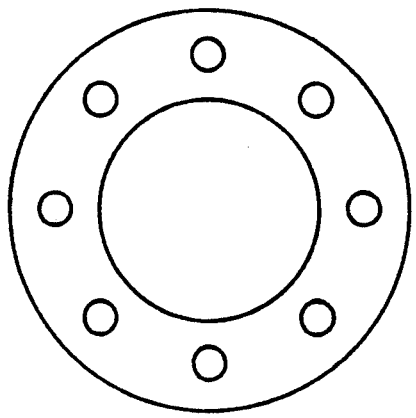

The component elements of magnetic switch 64 ar depicted in FIGS. 12–23, which include the typical dimensions for each of the component elements of magnetic switch 64, as identified as follows:

FIGS. 12A and 12B depict views of an inner conductor output stage of the magnetic switch.

FIGS. 13A and 13B depict views of brass standoffs which form part of the output stage.

FIGS. 14A and 14B depict views of upper second turn plates of the output stage of the magnetic switch.

Figure 15A:
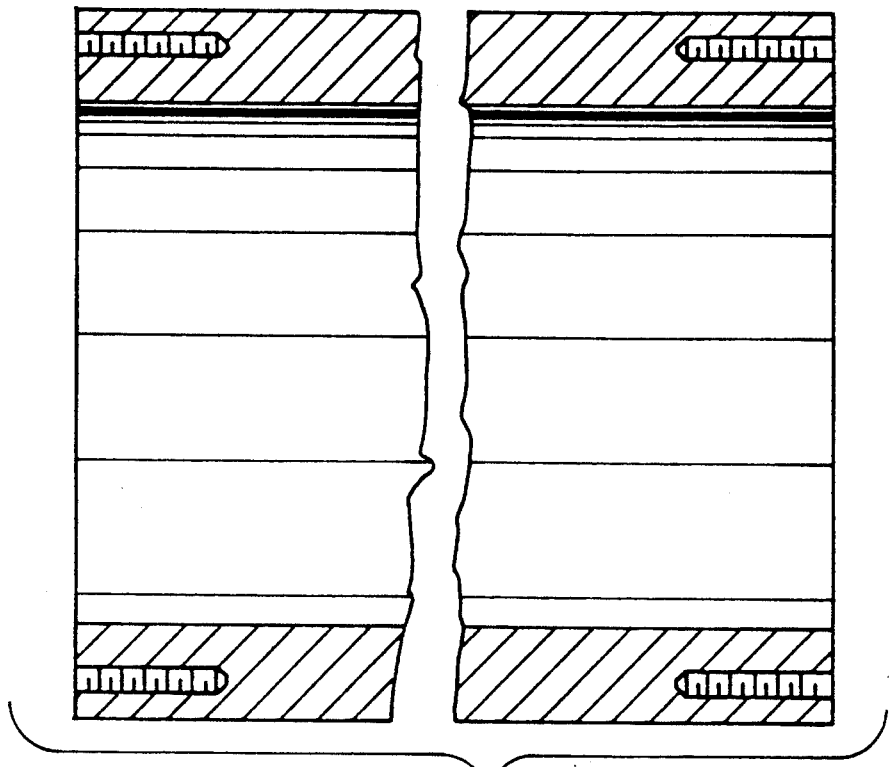
Figure 15B:
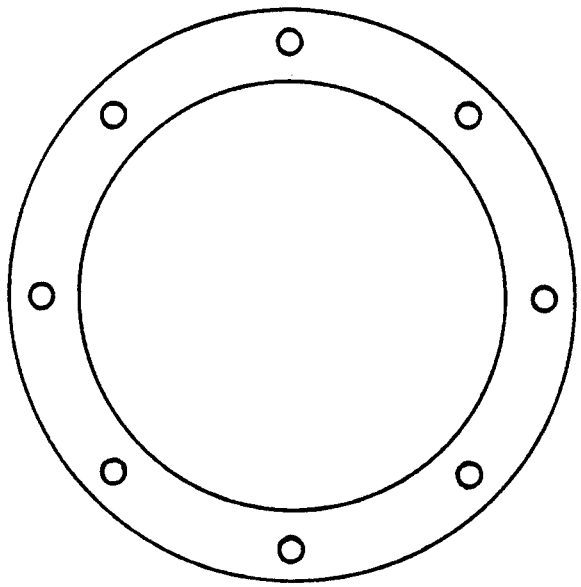

FIGS. 15A and 15B depict views of a core mandrel output stage of the magnetic switch.

Figure 16A:
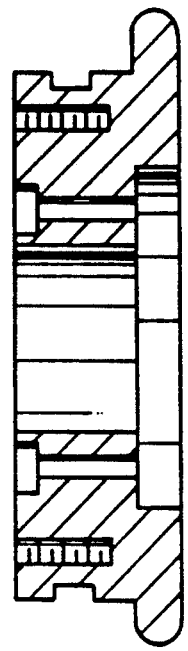
Figure 16B:
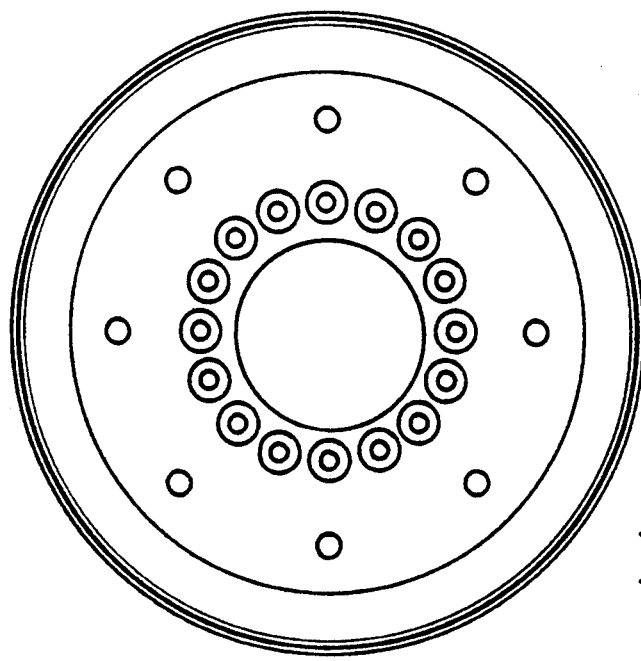
Figure 17A:
Figure 17B:
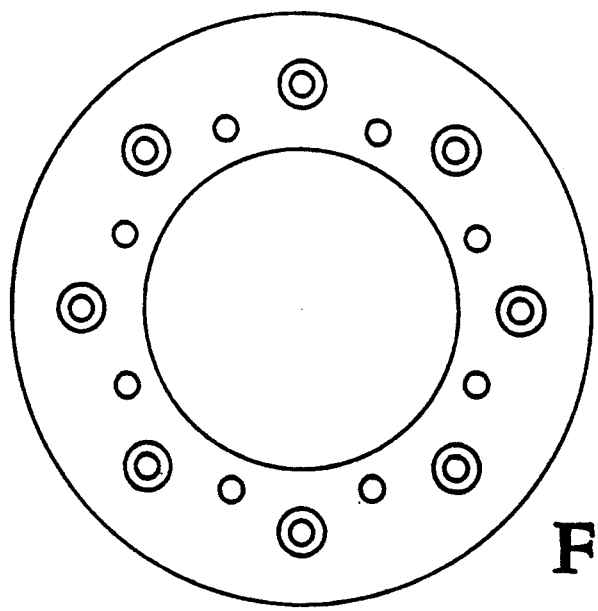

FIGS. 16A and 16B depict views of inboard high voltage terminals of the output stage of the magnetic FIGS. 17A and 17B depict views of an upper ferrite retainer of the output stage of the magnetic switch.

Figure 18A:
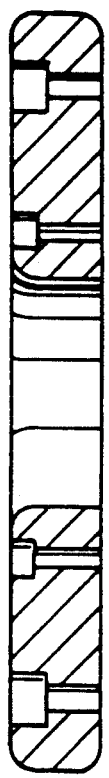
Figure 18B:
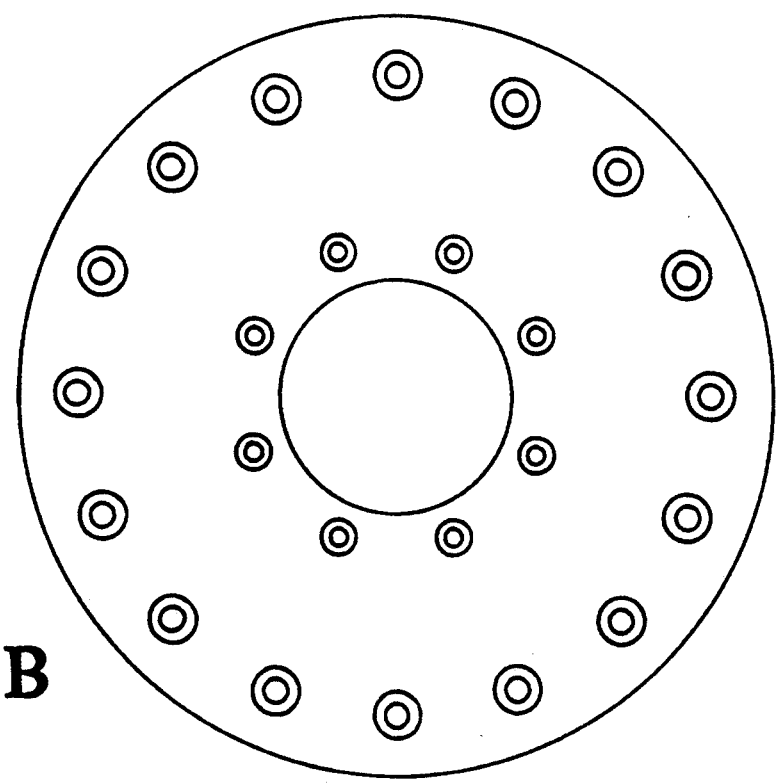

FIGS. 18A and 18B depict views of a bottom first turn plate of the output stage of the magnetic switch.

Figure 19A:
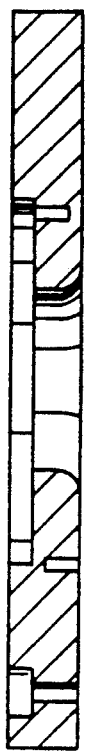
Figure 19B:
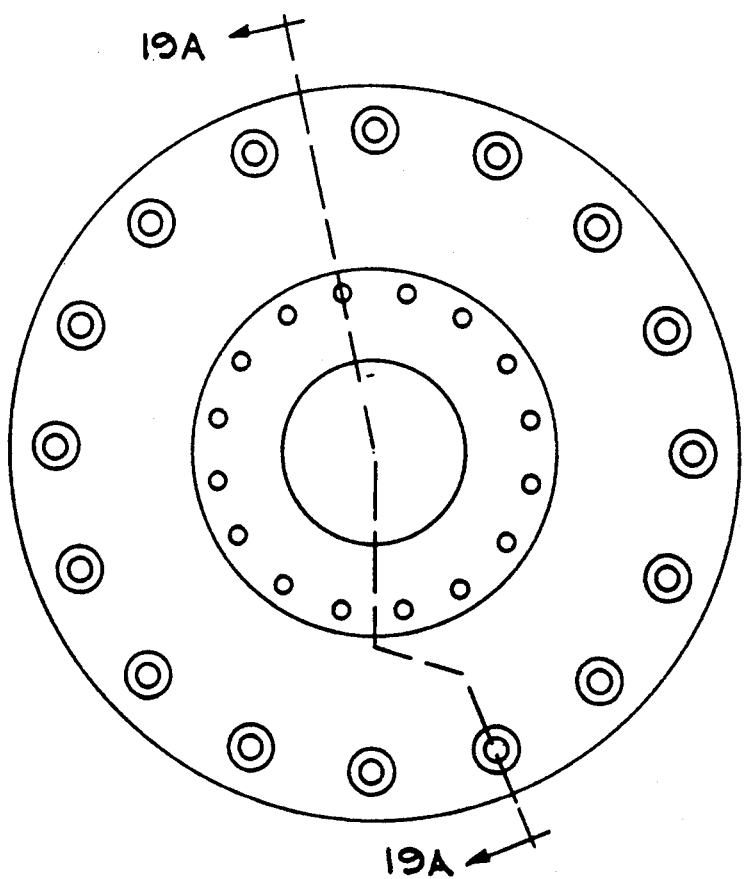

FIGS. 19A and 19B depict views of bottom plate output stage of the magnetic switch.

Figure 20A:
Figure 20B:
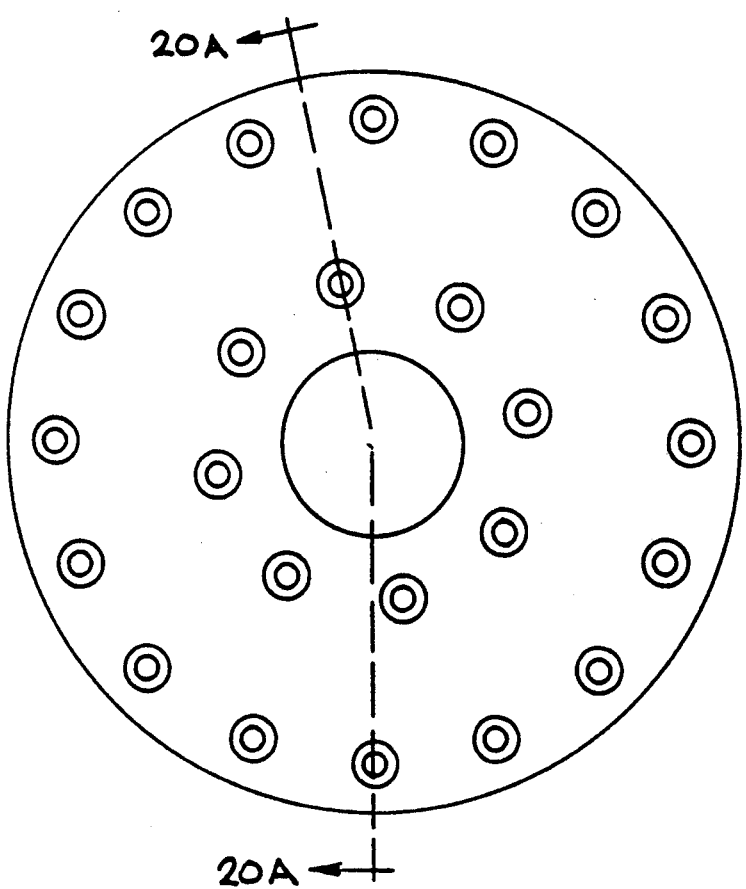

FIGS. 20A and 20B depict views of a Lexan support plate output stage of the magnetic switch.

Figure 21B:
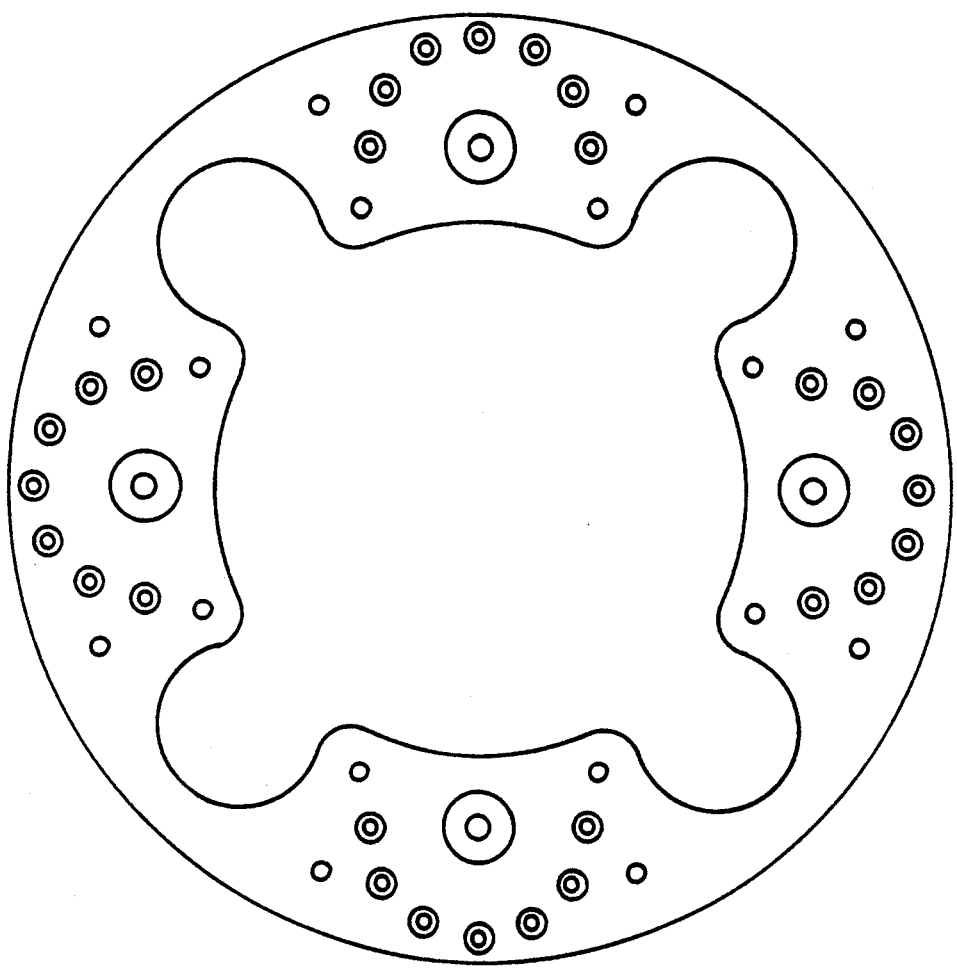
Figure 21A:
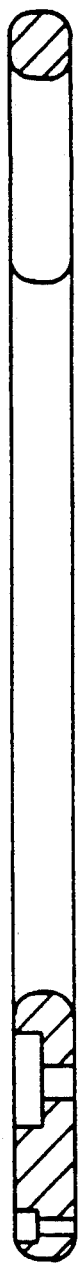

FIGS. 21A and 21B depict views of a capacitor shield plate of the output stage of the magnetic switch.

Figure 22A:
Figure 22B:
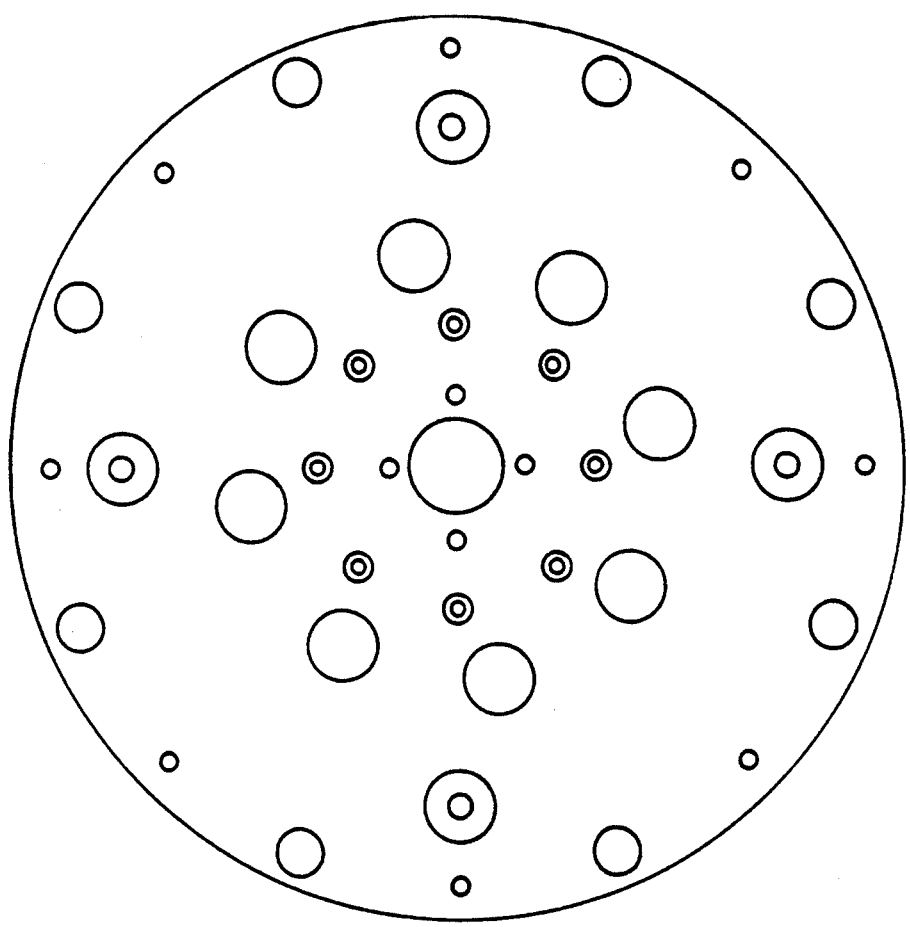

FIGS. 22A and 22B depict views of a full voltage bus output stage of the magnetic switch.

Figure 23A:
Figure 23B:
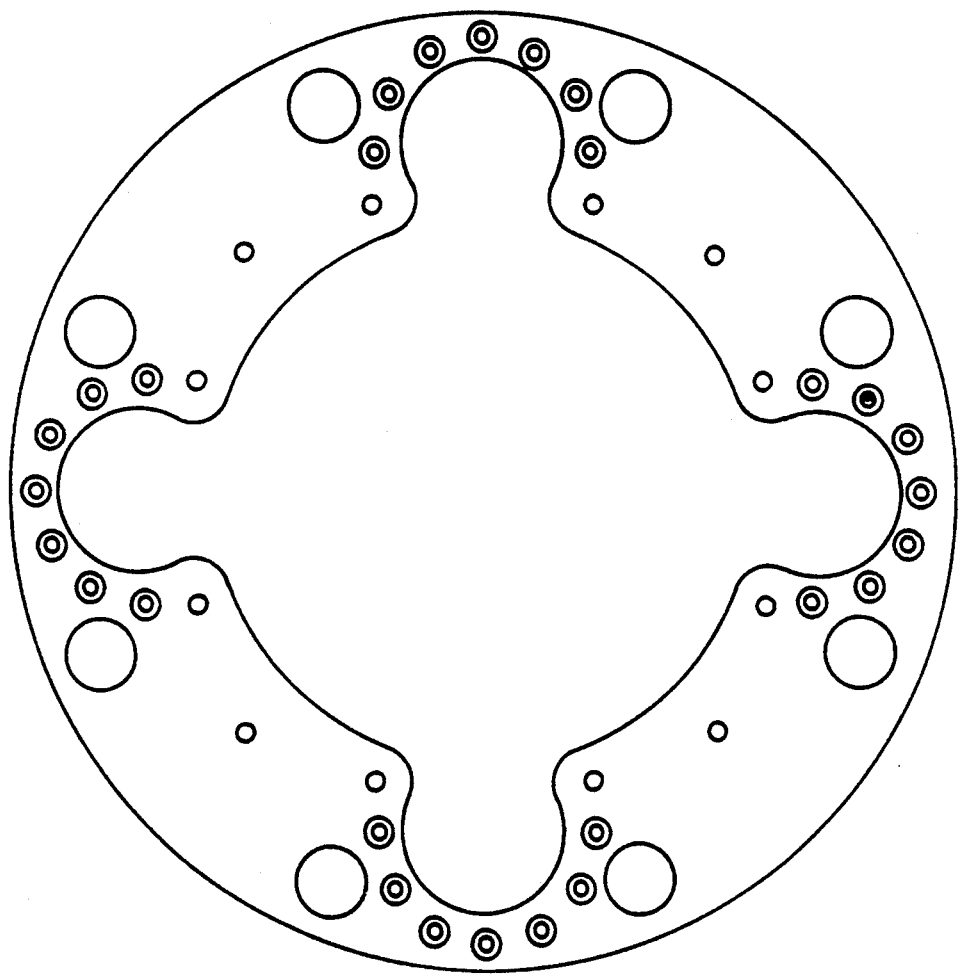

FIGS. 23A and 23B depicts views of a capacitor half volt bus of the output stage of the magnetic switch.

The foregoing description of a preferred embodiment of the invention is presented for purpose of illustration and description. It is not intended to be exhaustive or to limit the invention to the precise form disclosed, and obviously many modifications and variations are possible in light of the above teaching. For example, the present invention can be utilized with thyratron or solid state means for generating the first series of laser pulses. The present invention is a magnetic compression laser driving circuit having applications to metal vapor lasers as well as rare gas lasers. Also, the present invention could have applications to any load which requires a high voltage driving pulse.

The present embodiment was chosen and described in order to best explain the principles of the invention and its practical application to thereby enable other skilled in the art to best utilize the invention in various embodiments and with various modifications as are suited to the particular us contemplated. It is intended that the scope of the invention be defined by the claims appended hereto.

What is claimed is:

1. A magnetic compression laser driving circuit comprising
   a laser,
   means for generating a first series of voltage pulses having a first duration where said pulses have a first amplitude,
   magnetic compression means for compressing said first series of voltage pulses to generate a second series of voltage pulses having a second, compressed duration and a second amplitude, larger than said first amplitude, said magnetic compression means including multi-stage switch means where the last stage of said switch means has at least two turns and a sufficient amount of magnetic core material contained therein to provide increased efficiency of operation of said circuit with said at least two turns, and
   means for applying said second series of pulses to said laser to effect generation of a series of laser pulses corresponding to said second series of voltage pulses.

2. A circuit as in claim 1 wherein said magnetic transformer switch means of said last stage includes three turns.

3. A circuit as in claim 1 wherein said means for generating includes thyratron means.

4. A circuit as in claim 1 wherein said means for generating includes solid state means.

5. A circuit as in claim 1 wherein said laser is a metal vapor laser.

6. A circuit as in claim 1 wherein said laser is a rare gas laser.

7. A circuit as in claim 1 wherein said first series of pulses has a pulse duration of approximately 1.5 microseconds.

8. A circuit as in claim 7 wherein said first amplitude is approximately 20 Kilovolts.

9. A circuit as in claim 8 wherein said second pulse duration is approximately 40 nanoseconds.

10. A circuit as in claim 9 wherein said second amplitude is approximately 60 Kilovolts.

11. A magnetic compression load driving circuit comprising
    a load,
    means for generating a first series of voltage pulses having a first duration where said pulses have a first amplitude,
    magnetic compression means for compressing said first series of voltage pulses to generate a second series of voltage pulses having a second, compressed duration and a second amplitude, said magnetic compression means including multi-stage switch means where the last stage of said switch means has at least two turns and a sufficient amount of magnetic core material contained therein to provide increased efficiency of operation of said circuit with said at least two turns, and
    means for applying said second series of pulses to said load.

* * * * *